US012613261B2

(12) United States Patent
Kwon

(10) Patent No.: US 12,613,261 B2
(45) Date of Patent: Apr. 28, 2026

(54) SYSTEM WITH A MERGING UNIT FOR VARIABLY CONTROLLING AND SYNCHRONIZING SAMPLING FREQUENCY OF A SECONDARY CONVERTER

(71) Applicant: HYOSUNG HEAVY INDUSTRIES CORPORATION, Seoul (KR)

(72) Inventor: Hyo Chul Kwon, Suwon-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 192 days.

(21) Appl. No.: 18/571,731

(22) PCT Filed: Nov. 22, 2022

(86) PCT No.: PCT/KR2022/018524
§ 371 (c)(1),
(2) Date: Dec. 19, 2023

(87) PCT Pub. No.: WO2023/167389
PCT Pub. Date: Sep. 7, 2023

(65) Prior Publication Data
US 2024/0192255 A1     Jun. 13, 2024

(30) Foreign Application Priority Data
Mar. 4, 2022     (KR) ........................ 10-2022-0028061

(51) Int. Cl.
*G01R 19/25*        (2006.01)
*G01R 15/18*        (2006.01)
(52) U.S. Cl.
CPC ............. *G01R 19/25* (2013.01); *G01R 15/18* (2013.01)

(58) Field of Classification Search
CPC ................ G01R 19/25; G01R 19/2509; G01R 19/2513; G01R 19/252; G01R 21/133;
(Continued)

(56) References Cited

U.S. PATENT DOCUMENTS 6,289,267 B1 *   9/2001   Alexander ............... H02H 3/00
                                                    700/297
8,121,801 B2 *   2/2012   Spanier .............. G01R 19/2509
                                                    324/76.38
(Continued)

FOREIGN PATENT DOCUMENTS

EP          3112884 A1     1/2017
EP          3112884 B1 *   8/2023   ......... G01R 19/2513
(Continued)

*Primary Examiner* — Vinh P Nguyen
(74) *Attorney, Agent, or Firm* — NKL Law; Jae Youn Kim

(57)        ABSTRACT

A system with a merging unit for variably controlling and synchronizing a sampling frequency of a secondary converter is provided. The system facilitates the setting of sampling frequencies according to the types of various voltage/current transformers and stably collects sampling outputs of different sampling frequencies of various voltage/current transformers without collisions. The system for variably controlling the sampling frequency includes: a secondary converter, which collects analog data from a first sensor and converts the analog data into digital data; and a merging unit which collects analog data from a second sensor and converts the analog data into digital data while collecting the output of the secondary converter.

7 Claims, 3 Drawing Sheets

(58) Field of Classification Search

CPC .............. G01R 23/16; G01R 19/0092; G01R 19/2503; G01R 35/00; G01R 22/10; G01R 31/3167; G01R 19/00; G01R 19/0038; G01R 31/085; G01R 31/086; H02J 13/00002; G05B 2219/21126; G05B 2219/21137; G05B 2219/37533; G05B 2219/2612

See application file for complete search history.

(56) References Cited

U.S. PATENT DOCUMENTS

| | | | |
|---|---|---|---|
| 10,727,855 B2 * | 7/2020 | Sugiyama | H03M 1/1245 |
| 11,307,227 B2 * | 4/2022 | Spanier | G01R 19/2509 |
| 2003/0189423 A1 | 10/2003 | MacDonald et al. | |
| 2010/0153036 A1 | 6/2010 | Elwarry et al. | |
| 2015/0316593 A1 * | 11/2015 | Oda | G01R 21/133 |
| | | | 702/60 |

FOREIGN PATENT DOCUMENTS

| | | | |
|---|---|---|---|
| KR | 101012464 B1 | 2/2011 | |
| KR | 101151127 B1 | 6/2012 | |
| KR | 20130100687 A | 9/2013 | |
| KR | 10-1443202 B1 | 9/2014 | |
| KR | 101462229 B1 | 11/2014 | |
| KR | 2016105674 A | 6/2016 | |
| KR | 10-2537804 B1 | 1/2021 | |
| KR | 102327251 B1 | 11/2021 | |

* cited by examiner

SYSTEM WITH A MERGING UNIT FOR VARIABLY CONTROLLING AND SYNCHRONIZING SAMPLING FREQUENCY OF A SECONDARY CONVERTER

TECHNICAL FIELD

The present invention relates to a system for variably controlling a sampling frequency, and more specifically, to variably setting sampling frequencies of various sensor signals to perform sampling. That is, the present invention relates to a system for variably controlling a sampling frequency capable of collecting outputs of different sampling frequencies for various sensor signals without collisions.

BACKGROUND ART

A power system for supplying power is made up of power plants, transmission lines, substations, distribution lines, and the like, and in the field of power facility management systems which manage these power facilities, integration, automation, and remote monitoring that minimize human work are being promoted. Specifically, a substation automation system is a system for monitoring, controlling, and protecting various pieces of power equipment installed in the substation.

In the power facility management system, a merging unit is a device which receives analog signals of a voltage transformer (VT) or current transformer (CT) in the substation and performs analog-digital conversion, and then transmits the converted digital signals to an intelligent electronic device (IED) for protection control at a bay level through a process bus in a form of a sampled value according to the IEC 61850 9-2 standard.

Research for connecting the merging unit to various types of voltage/current transformers to perform stable sampling and transmit sampling data is continuing.

For example, in Korean Laid-Open Patent Publication No. 10-2013-0092803, a merging unit capable of providing a frequency protection function required in a substation without other separate devices by having a frequency measurement function and a frequency protection function using an analog voltage signal having a sine wave form was proposed.

However, even in this case, there is a disadvantage that it is difficult to variably set a sampling frequency according to types of various voltage/current transformers.

DISCLOSURE

Technical Problem

The present invention is directed to providing a system for variably controlling a sampling frequency which facilitates the setting of sampling frequencies according to the types of various voltage/current transformers.

The present invention is directed to providing a system for variably controlling a sampling frequency which stably collects sampling outputs of different sampling frequencies of various voltage/current transformers without collisions.

Technical Solution

One aspect of the present invention provides a system for variably controlling a sampling frequency including a secondary converter configured to collect analog data from a first sensor and convert the analog data to digital data, and a merging unit configured to collect analog data from a second sensor and convert the analog data to digital data while collecting the output of the secondary converter.

Here, the merging unit may transmit sampling frequency setting information to the secondary converter.

Further, the merging unit may transmit a one pulse per second (1PPS) signal to the secondary converter as a reference time.

Here, the merging unit may transmit a synchronization signal according to the IEEE1588 standard to the secondary converter as a reference time.

Further, the secondary converter may transmit sampled data in synchronization with the reference time received from the merging unit.

Here, the secondary converter may be composed of a first analog/digital (A/D) converter configured to perform A/D conversion on a measurement sample signal, a second A/D converter configured to perform A/D conversion on a protection sample signal, a multiplexer configured to selectively collect the output of the first A/D converter and the output of the second A/D converter and transmit the output to the merging unit, and a buffer configured to perform buffering on the latter output among the output of the first A/D converter and the output of the second A/D converter and transfer the output to the multiplexer.

Further, the first A/D converter may perform A/D conversion on the measurement sample signal with a sampling frequency transmitted from the merging unit.

Here, the second A/D converter may perform A/D conversion on the protection sample signal with a sampling frequency transmitted from the merging unit.

Further, the buffer may store the latter output when the output of the first A/D converter and the output of the second A/D converter collide, and the output stored in the buffer may be sent to the multiplexer and transmitted to the merging unit after data of the first output is collected in the multiplexer and transmitted to the merging unit.

In addition, in the buffer, data to be output first may be selected according to a priority set by a user when the output of the first A/D converter and the output of the second A/D converter are output with completely the same time clock.

Here, the first A/D converter and the second A/D converter may perform A/D conversion in synchronization with a reference signal transmitted from the merging unit.

Further, the first A/D converter and the second A/D converter may divide a reference clock synchronized with a reference signal to generate a sampling frequency, and may perform redistribution to be synchronized with an AC synchronization signal, which is an AC signal used in at least one of the first sensor or the second sensor, when the reference clock frequency is not a multiple of the sampling frequency.

In addition, each of the first sensor and the second sensor may include at least one of a voltage transformer (VT) or a current transformer (CT).

Advantageous Effects

A system for variably controlling a sampling frequency according to the present invention has an advantage of facilitating the setting of sampling frequencies according to the types of various voltage/current transformers.

Further, the system for variably controlling a sampling frequency has an advantage of collecting sampling outputs of different sampling frequencies of various voltage/current transformers without collisions.

MODES OF THE INVENTION

Figure 1:
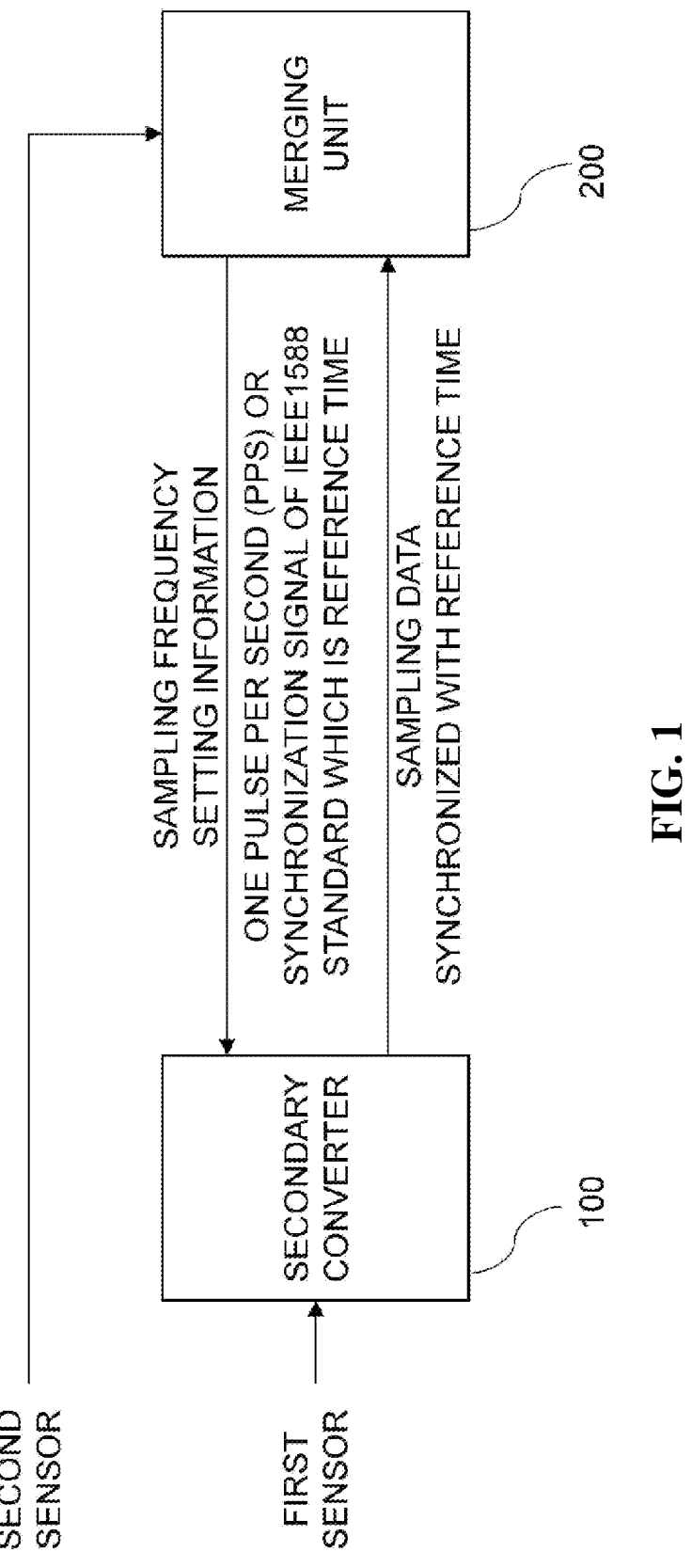
FIG. 1 is a configuration diagram illustrating a system for variably controlling a sampling frequency according to one embodiment of the present invention.

Specific embodiments for carrying out the present invention will be described with reference to the accompanying drawings.

Since the present invention may be variously changed and have various embodiments, specific embodiments will be exemplified in the drawings and described in detail in the detailed description. This is not intended to limit the present invention to specific embodiments, and it may be understood that all changes, equivalents, and substitutions included in the spirit and technical scope of the present invention are included.

Hereinafter, a system for variably controlling a sampling frequency according to the present invention will be described in detail with reference to the accompanying drawings.

Figure 2:
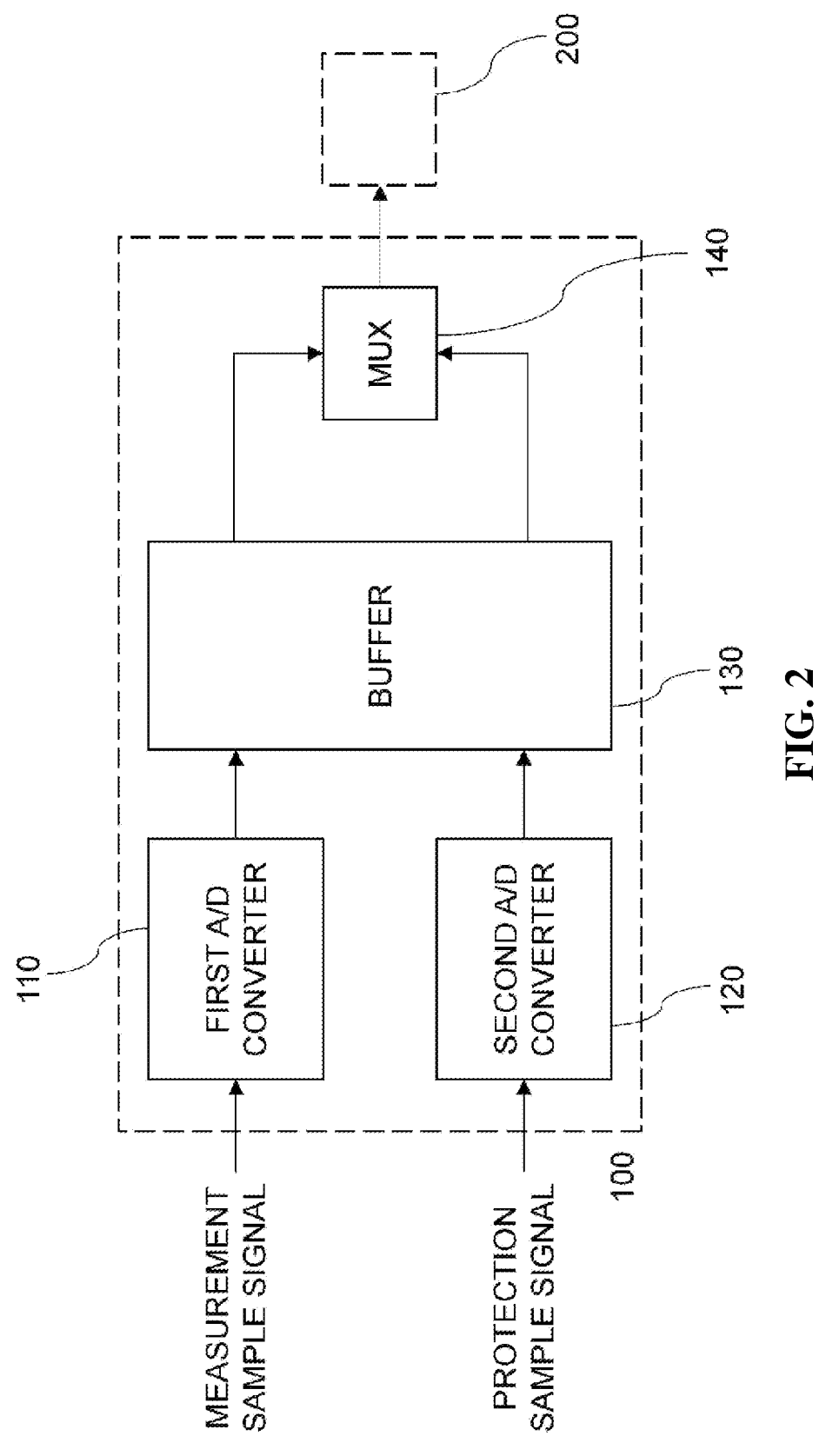
FIG. 2 is a block diagram illustrating a secondary converter in FIG. 1 in detail.
Figure 3:
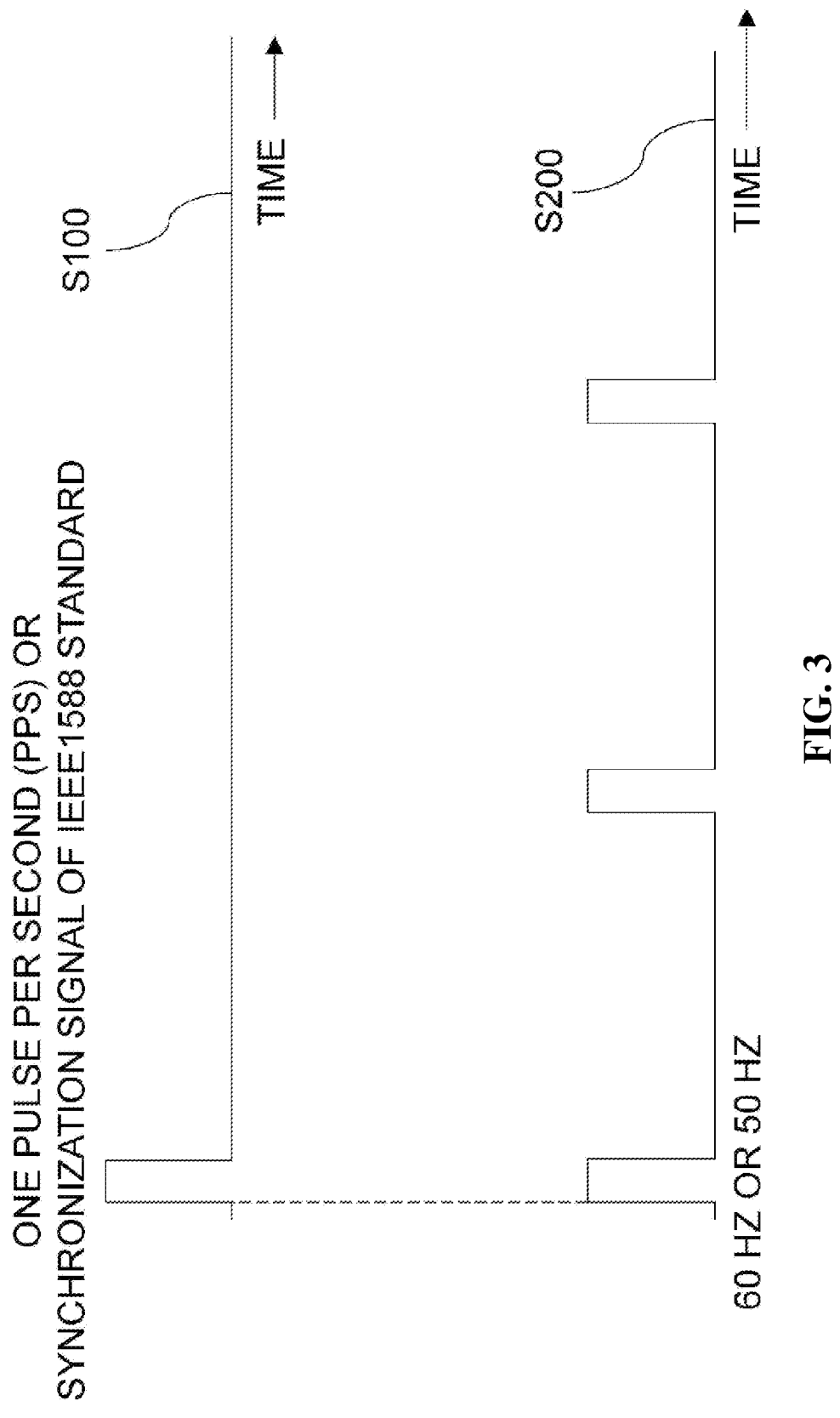
FIG. 3 illustrates a portion of a waveform transmitted to the secondary converter by a merging unit in FIG. 1.

FIG. 1 is a configuration diagram illustrating a system for variably controlling a sampling frequency according to one embodiment of the present invention, and FIGS. 2 and 3 are detailed block diagrams for describing FIG. 1 in detail.

Hereinafter, the system for variably controlling a sampling frequency according to one embodiment of the present invention will be described with reference to FIGS. 1 to 3.

First, referring to FIG. 1, the system for variably controlling a sampling frequency according to one embodiment of the present invention is composed of a secondary converter 100 which collects analog data from a first sensor and converts the analog data to digital data, and a merging unit 200 which collects analog data from a second sensor and converts the analog data to digital data while collecting the output of the secondary converter 100.

Here, the merging unit 200 transmits sampling frequency setting information to the secondary converter 100.

Further, the merging unit 200 transmits a one pulse per second (1PPS) signal or a synchronization signal according to the IEEE1588 standard to the secondary converter 100 as a reference time.

Meanwhile, the secondary converter 100 transmits sampled data in synchronization with the reference time received from the merging unit 200.

In the present invention, an analog output of a conventional voltage transformer or current transformer may be classified as signals of the second sensor, and these signals may be directly matched to the merging unit 200.

However, a recently developed voltage or current transformer such as a Rogowski coil or the like cannot be directly matched to the merging unit 200, and thus in the present invention, may be classified as a first sensor, and a separate secondary converter 100 for matching these signals to the merging unit 200 is required.

The merging unit 200 serves to collect the digital conversion output of the second sensor which is directly matched and the digital conversion output of the first sensor performed by the secondary converter 100 and transmit the same to an upper unit.

In this case, the secondary converter 100 should be used by changing the sampling frequency according to the type of first sensor, but since a conventional secondary converter 100 is not configured to receive information from the merging unit 200, the secondary converter 100 may not receive change information from the merging unit 200, and accordingly, there is the inconvenience that separate setting should be performed for each of the secondary converters 100.

The system for variably controlling a sampling frequency according to the present invention is configured to transmit sampling frequency setting information from the merging unit 200 to the secondary converter 100 to solve such inconvenience.

Accordingly, in the present invention, not only the sampling frequency setting information but also the 1PPS signal or the synchronization signal according to IEEE1588 standard, which is the reference time, may be transmitted, and the secondary converter 100 may transmit sampling data synchronized with this reference time to the merging unit 200. Hereinafter, this will be described in detail in FIGS. 2 and 3

FIG. 2 is a block diagram illustrating the secondary converter 100 in FIG. 1 in detail.

As shown in FIG. 2, the secondary converter is composed of a first analog/digital (A/D) converter 110 which performs A/D conversion on a measurement sample signal, a second A/D converter 120 which performs A/D conversion on a protection sample signal, a multiplexer (MUX) 140 which selectively collects the output of the first A/D converter 110 and the output of the second A/D converter 120 and transmits the same to the merging unit 200, and a buffer 130 which performs buffering on the latter output among the output of the first A/D converter 110 and the output of the second A/D converter 120 and transmits the buffered output to the multiplexer (MUX) 140.

In this case, the first A/D converter 110 performs A/D conversion on the measurement sample signal with the sampling frequency transmitted from the merging unit 200, and the second A/D converter 120 performs A/D conversion on the protection sample signal with the sampling frequency transmitted from the merging unit 200.

Here, the buffer 130 of the present invention stores the latter output when the output of the first A/D converter 110 and the output of the second A/D converter 120 collide in the multiplexer (MUX) 140. Then, the output of latter data stored in the buffer 130 is sent to the multiplexer (MUX) 140 to be transmitted to the merging unit 200 after data of the first output is collected in the multiplexer (MUX) 140 and transmitted to the merging unit 200.

In this case, data to be output first may be selected according to a priority set by a user when the output of the first A/D converter 110 and the output of the second A/D converter 120 are output with completely the same time clock.

The secondary converter 100 matches the measurement sample signal for measuring a current state of the voltage transformer or current transformer and the protection sample signal for measuring the current state of the voltage transformer or current transformer based on a measurement range set according to equipment protection standards for voltage transformers or current transformers.

Further, the multiplexer (MUX) 140 collects the output of the first A/D converter 110 which converts the measurement sample signal to a digital signal, and the output of the second A/D converter 120, which converts the protection sample signal to a digital signal.

Here, the first A/D converter 110 and the second A/D converter 120 perform sampling with sampling frequencies transmitted from the merging unit 200, and the sampling frequency of the first A/D converter 110 and the sampling frequency of the second A/D converter 120 may be different from each other, and in some cases, collisions may occur during collection in the multiplexer (MUX) 140.

Meanwhile, when a collision occurs in the multiplexer (MUX) 140, in the present invention, the collided data is stored in the provided buffer 130 in advance, and the data which is output first is transmitted from the multiplexer (MUX) 140 to the merging unit 200, and then the stored data is transmitted to the multiplexer (MUX) 140.

Accordingly, the system for variably controlling a sampling frequency according to the present invention may perform sampling using different sampling frequencies in the first A/D converter 110 and the second A/D converter 120 of the secondary converter 100, and may transmit the collided data to the merging unit 200 so that the collided data may not be lost even when a collision occurs during collection of the outputs of the first A/D converter 110 and the second A/D converter 120 in the multiplexer (MUX) 140.

Next, FIG. 3 illustrates a portion of a waveform transmitted to the secondary converter 100 by the merging unit 200 in FIG. 1.

As shown in FIG. 3, in the present invention, the first A/D converter 110 and the second A/D converter 120 of secondary converter 100 perform A/D conversion in synchronization with a reference signal S100 transmitted from the merging unit 200.

Further, the first A/D converter 110 and the second A/D converter 120 divide a reference clock synchronized with the reference signal S100 to generate a sampling frequency, and at this time, perform redistribution to be synchronized with an AC synchronization signal S200 when the reference clock frequency is not a multiple of the sampling frequency.

That is, the reference signal S100 of the present invention may be composed of a 1PPS signal synchronized with a global positioning system (GPS) or a synchronization signal of the IEEE1588 standard transmitted over a network, and sampling may be performed so that the frequency sampled in the secondary converter 100 may be synchronized with the reference signal S100.

As described above, the sampling frequency of the present invention is generated by dividing the reference clock, and redistribution is performed so that the sampling frequency is synchronized with the AC synchronization signal S200 when the reference clock frequency is not a multiple of the sampling frequency.

That is, in the present invention, the signals of the first sensor and the second sensor are signals output from a voltage transformer or current transformer, for example, this voltage transformer or current transformer may operate with 60 Hz or 50 Hz as an alternating current signal, and in the present invention, as the sampling frequency is synchronized with the AC synchronization signal S200, which is an AC signal used in a voltage transformer or current transformer, the measurement sample signal and the protection sample signal may be sampled at the same phase for one cycle.

As described above, the system for variably controlling a sampling frequency according to the present invention has an advantage of facilitating the setting of sampling frequencies according to the types of various voltage/current transformers, and has an advantage of collecting sampling outputs of different sampling frequencies from various voltage/current transformers without collision.

The above description includes examples of one or more embodiments. Of course, it is not possible to describe all possible combinations of components or methods to describe the above-described embodiments, and it may be recognized by those skilled in the art that additional combinations and substitutions are possible. Accordingly, the described embodiments include all alternatives, modifications, and alterations that fall within the spirit and scope of the appended claims.

INDUSTRIAL APPLICABILITY

The present invention relates to a system for variably controlling a sampling frequency, and is usable in the field of power facility management systems.

The invention claimed is:

1. A system for variably controlling and synchronizing a sampling frequency, the system comprising:
   a secondary converter configured to collect first analog data from a first sensor and convert the first analog data to first digital data; and
   a merging unit configured to collect second analog data from a second sensor and convert the second analog data to second digital data while collecting an output of the secondary converter,
   wherein the secondary converter includes:
   a first analog/digital (A/D) converter configured to perform A/D conversion on a measurement sample signal for measuring a current state of a voltage transformer (VT) or a current transformer (CT) to generate the first digital data;
   a second A/D converter configured to perform the A/D conversion on a protection sample signal based on a measurement range set according to equipment protection standards for the VT or the CT to generate the first digital data;
   a multiplexer configured to selectively collect an output of the first A/D converter and an output of the second A/D converter and transmit the collected output to the merging unit; and
   a buffer configured to perform buffering on a latter output among the output of the first A/D converter and the output of the second A/D converter and transmit the buffered output to the multiplexer, and
   wherein the first A/D converter and the second A/D converter divide a reference clock synchronized with a reference signal to generate the sampling frequency, and perform redistribution to be synchronized with an AC synchronization signal when a reference clock frequency is not a multiple of the sampling frequency, the AC synchronization signal being an AC signal used in at least one of the first sensor or the second sensor.

2. The system of claim 1, wherein the first A/D converter performs the A/D conversion on the measurement sample signal with the sampling frequency transmitted from the merging unit.

3. The system of claim 1, wherein the second A/D converter performs the A/D conversion on the protection sample signal with the sampling frequency transmitted from the merging unit.

4. The system of claim 1, wherein the buffer stores the latter output when the output of the first A/D converter and the output of the second A/D converter collide, and the output stored in the buffer is sent to the multiplexer and transmitted to the merging unit after data of the first output is collected in the multiplexer and transmitted to the merging unit.

5. The system of claim 4, wherein, in the buffer, data to be output first is selected according to a priority set by a user when the output of the first A/D converter and the output of the second A/D converter are output with completely the same time clock.

6. The system of claim 1, wherein the first A/D converter and the second A/D converter perform the A/D conversion in synchronization with a reference signal transmitted from the merging unit.

7. The system of claim 1, wherein each of the first sensor and the second sensor includes at least one of the VT or the CT.

* * * * *